(12) United States Patent
Woychik et al.

(10) Patent No.: US 10,177,114 B2
(45) Date of Patent: Jan. 8, 2019

(54) HYBRID 3D/2.5D INTERPOSER

(71) Applicant: Invensas Corporation, San Jose, CA (US)

(72) Inventors: Charles G. Woychik, San Jose, CA (US); Cyprian Emeka Uzoh, San Jose, CA (US); Sangil Lee, Santa Clara, CA (US); Liang Wang, Milpitas, CA (US); Guilian Gao, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 127 days.

(21) Appl. No.: 14/952,482

(22) Filed: Nov. 25, 2015

(65) Prior Publication Data

US 2017/0148763 A1    May 25, 2017

(51) Int. Cl.
| | | |
|---|---|---|
| H01L 23/00 | (2006.01) | |
| H01L 25/065 | (2006.01) | |
| H01L 25/00 | (2006.01) | |
| H01L 21/48 | (2006.01) | |
| H01L 23/31 | (2006.01) | |

(52) U.S. Cl.
CPC ...... *H01L 25/0652* (2013.01); *H01L 21/4803* (2013.01); *H01L 21/486* (2013.01); *H01L 24/02* (2013.01); *H01L 25/0657* (2013.01); *H01L 25/50* (2013.01); *H01L 23/3107* (2013.01); *H01L 2224/02331* (2013.01); *H01L 2224/02379* (2013.01); *H01L 2225/0652* (2013.01); *H01L 2225/06513* (2013.01); *H01L 2225/06524* (2013.01); *H01L 2225/06548* (2013.01); *H01L 2225/06586* (2013.01)

(58) Field of Classification Search
CPC ........... H01L 25/0652; H01L 23/49827; H01L 23/5384; H01L 23/4982; H01L 25/0657; H01L 25/50; H01L 21/486; H01L 21/4803; H01L 24/02; H01L 2225/06548; H01L 2225/0652; H01L 2224/02379; H01L 2224/02331; H01L 2225/06524; H01L 2225/06513; H01L 2225/06586; H01L 23/3107
See application file for complete search history.

(56) References Cited

U.S. PATENT DOCUMENTS

| | | | |
|---|---|---|---|
| 2015/0091182 A1* | 4/2015 | Chiu | H01L 23/15 257/774 |
| 2015/0102498 A1* | 4/2015 | Enicks | H01L 21/486 257/774 |
| 2018/0204816 A1 | 7/2018 | Yu et al. | |

OTHER PUBLICATIONS

BYU Dept. of Electronic and Computer Engineering, "Coefficient of Thermal Expansion (CTE)," downloaded Oct. 3, 2016 from http://www.cleanroom.byu.edu/CTE_Materials.phtml, date not shown, 1 page.

(Continued)

*Primary Examiner* — Latanya N Crawford

(57) ABSTRACT

Representative implementations of devices and techniques provide a hybrid interposer for 3D or 2.5D package arrangements. A quantity of pockets is formed on a surface of a carrier in a predetermined pattern. The pockets are filled with a reflowable conductive material. Chip dice are coupled to the interposer carrier by fixing terminals of the dice into the pockets. The carrier may include topside and backside redistribution layers to provide fanout for the chip dice, for coupling the interposer to another carrier, board, etc. having a pitch greater than that of the chip dice.

21 Claims, 14 Drawing Sheets

(56) References Cited

OTHER PUBLICATIONS

Maxfield, Clive, "2D vs. 2.5D vs. 3D ICs 101," downloaded Oct. 3, 2016 from http:/www.eetimes.com/documents.asp?. doc_id= 1279540, Apr. 8, 2012, 12 pages.

Nah, Jae Woong et al., "Injection Molded Solder—a New Fine Pitch Substrate Bumping Method," IBM T.J. Watson Research Center, Yorktown Hts, NY & IBM Systems & Technology Group, Kyoto, Japan, Electronic Components and Technology Conference, 2009, pp. 61-66.

* cited by examiner

HYBRID 3D/2.5D INTERPOSER

BACKGROUND

As integrated circuit (IC) chip technology matures, smaller die packages are possible due to smaller and denser ICs. In many cases multiple small IC chips may be packaged together in a common package. In one example, the multiple IC chips may comprise components or systems that function together as part of a larger component or system (e.g., system-in-package (SiP), etc.). The IC chips may be mounted to a common carrier (e.g., substrate, wafer, panel, etc.) or base layer, for instance. The IC chips may be interconnected by one or more wiring or interconnection layers (e.g., metallization layers) associated with the common carrier. Additionally, connection terminals (such as flip-chip bumps, for example) can be added to the metallization layer(s) of the common carrier for connection of the die package to a circuit board, or the like.

In some cases, several packages containing the multiple IC chips may be coupled to a common SiP substrate, or the like, which may be coupled to the circuit board via terminals (e.g., flip-chip bumps, wire bonds, etc.) on the SiP substrate. In other cases, to manage the potential wiring congestion of such an arrangement and to fan out the connections to a workable scale, a silicon interposer may be used between the die packages and the SiP substrate.

For example, the dies may be coupled to the silicon interposer via fine pitch connections (e.g., ~10 um diameter terminals) and the silicon interposer may be coupled to the SiP substrate via larger pitch connections (e.g., ~100 um diameter terminals). The SiP substrate may then be coupled to the circuit board, or the like, via terminals sized to accommodate the circuit board.

The silicon interposer often has topside and backside metal layers formed using a similar process as that of the metallization layers of the silicon IC chips. Metallic through-silicon vias (TSVs) can be formed through the silicon interposer, which route connections on the topside to connections on the backside of the silicon interposer.

The use of a silicon interposer to couple multiple dice to an SiP substrate, for example, is often referred to as a 2.5D packaging scheme, and it offers increased capacity and performance as compared to packaging schemes without the silicon interposer. Further, some 3D packaging schemes include stacking two or more dice on top of each other, with the bottom-most die (or dice in multiple-stack arrangements) coupled to the silicon interposer.

However, there can be a variety of challenges to implementing these arrangements. For example, consistent die placement accuracy, along with alignment requirements between dice can be problematic. This is further complicated by the fine pitch connection terminals of the dies. Also, a desired reliability of a fine pitch redistribution layer (RDL) (e.g., a line/space width of ~2-5 um) can be difficult to achieve over a molded surface (e.g., die package overmold). Further, it can be non-trivial to achieve a desired yield and reliability of metal traces across a silicon/overmold border.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Figure 1:
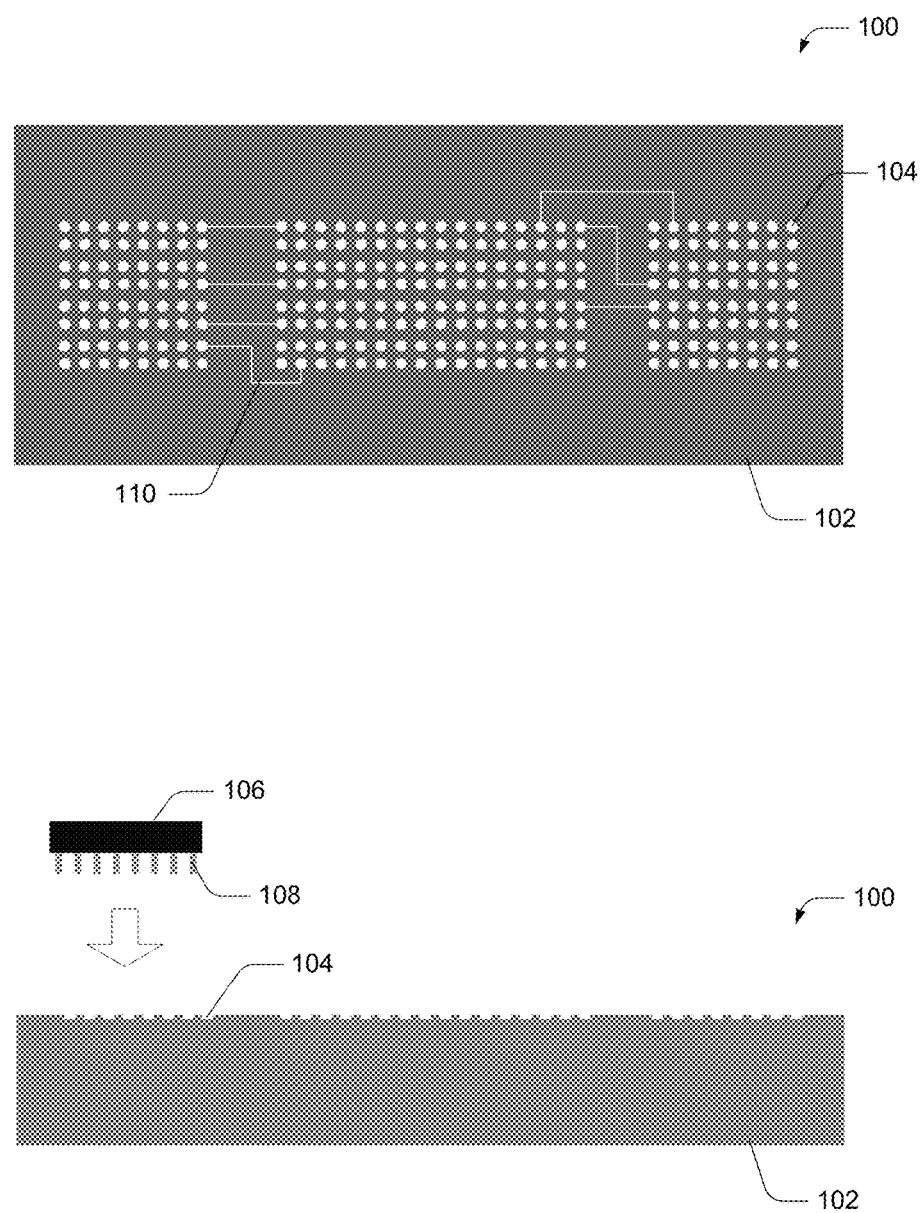
FIG. 1 shows top and side views of an example carrier that may be implemented as a hybrid interposer, according to an implementation.

Representative implementations of devices and techniques provide a hybrid interposer for use with 3D and 2.5D microelectronic component package arrangements (and other package arrangements). In various embodiments, the hybrid interposer comprises a non-silicon (e.g., glass, polyglass, poly-crystal, ceramic, glass-ceramic, liquid crystal materials, invar, materials with negative thermal expansion, metals, composite, etc.) carrier with a quantity of formed pockets (e.g., cavities, hollows, receptacles, openings, etc.) at predetermined locations on a topside surface (i.e., the surface of the interposer having the pockets) of the hybrid interposer. In alternate embodiments, the hybrid interposer is comprised of silicon, polysilicon, or other semi-conductor material.

In an implementation, the pockets are filled, or at least partially filled, with a reflowable conductive material (e.g., solder, etc.). Other metallization may also be added to the topside surface of the hybrid interposer, forming interconnections between pockets, metallization within the pockets, and/or a redistribution layer (RDL) for mounted components. Chip dice (or other microelectronic components) are coupled to the interposer carrier by fixing terminals of the dice into the pockets. In some examples, the terminals of the dice may be fixed to the pockets of the carrier by mass reflow, or the like. In the examples, metallic structures may be formed within the pockets, comprising the terminals and the reflowable conductive material. In some examples, the metallic structures may include additional conductive layers or materials that are added to the pockets.

In various implementations, at least a portion of the backside surface (i.e., the surface of the interposer opposite the surface with the pockets) of the interposer carrier is removed, exposing at least a subset of the pockets (and the metallic structures within the pockets) through the backside of the interposer. The interposer may include topside and backside redistribution layers (RDL) to provide fanout for the chip dice, and for coupling the interposer to another carrier, board, etc., having a pitch greater than a pitch of the chip dice. In an implementation, the topside of the interposer carrier may include conductive interconnects formed between some of the pockets or the metallic structures, which may comprise at least a portion of the topside RDL in some embodiments.

The metallic structures formed in the pockets and exposed on the backside of the interposer may function as vias to electrically couple the microelectronic components or the topside RDL to the backside RDL, for instance. In some embodiments, an additional layer is added to the backside of the interposer carrier to form the backside RDL. In other embodiments, backside terminals, such as flip-chip bumps, and the like, are coupled to the backside RDL, and may be used to couple the arrangement to a PCB board, or other carrier, for example.

In an implementation, 3D and 2.5D package assemblies may be formed by stacking multiple chip dice (or other microelectronic components) to the topside of the hybrid interposer. In the implementation, the terminals of the bottom-most die of a stack are inserted within and fixed to the pockets of the interposer. Dice in upper positions of the stack may communicate with the interposer through connections such as terminals, bumps, wirebonds, vias, and the like. In some embodiments, multiple stacks of dice may be arranged at locations along the topside surface of the interposer.

In alternate implementations, the entire interposer carrier may be removed once the metallic structures are formed within the pockets. In the implementations, adhesives, encapsulants, dielectrics, or other fillers may be used to form a surface around the metallic structures for forming the backside RDL or flip-chip bump connections. In various embodiments, the filler surface is formed prior to removal of the carrier. In another alternate implementation, the bottom die may be affixed to the surface of the interposer over the blind pockets without an adhesive layer. In the implementation, the pad region under the die overlying the said pocket or the conductive feature of the die is within the said pocket.

In various implementations, the techniques and components described herein may be arranged to accommodate terminal post pitch variability and post width and height variability, allowing freedom to use package designs with larger and smaller posts or pads, since these various variations in post heights are accommodated by the depth of the interposer pockets. Larger and smaller pitch scaling can also be accommodated, including pitch scaling of less than 20 microns. The use of the pockets provides built-in component self-alignment and substantially eliminates lateral displacement of components during post reflow. Additionally, a low cost mass reflow process may be used for convenience in high volume manufacturing and cost savings. The techniques and components described herein can also reduce or eliminate component warpage and solder bridging. In various implementations, other or additional advantages may also be present.

Various implementations and arrangements are discussed with reference to electrical and electronics components and varied carriers. While specific components (i.e., integrated circuit (IC) chip dice, wafers, substrates, printed circuit boards (PCB), discrete components, etc.) are mentioned, this is not intended to be limiting, and is for ease of discussion and illustrative convenience. The techniques and devices discussed are applicable to any type or number of packages, packaged circuits or components, circuits (e.g., integrated circuits (IC), mixed circuits, ASICS, memory devices, processors, etc.), electrical components (e.g., sensors, transistors, diodes, etc.), groups of components, carrier structures (e.g., wafers, substrates, panels, boards, PCBs, etc.), and the like. Each of these components, circuits, chips, structures, and the like, can be generically referred to as a "microelectronic element."

Implementations are explained in more detail below using a plurality of examples. Although various implementations and examples are discussed here and below, further implementations and examples may be possible by combining the features and elements of individual implementations and examples.

Example Hybrid Interposer

FIG. 1 shows top and side views of an example carrier 102 that may be implemented as a hybrid interposer 100, according to an implementation. The carrier 102 includes a plurality of pockets 104 at predetermined locations on the topside surface of the carrier 102 and in a predefined pattern. In various embodiments, the pockets 104 comprise openings that extend at least partially through the carrier 102. For example, the pockets 104 may be arranged to receive one or more specific microelectronic components 106 (e.g., chip dice, etc.). In an embodiment, the pockets 104 have a spacing that matches a pitch of terminals 108 of a microelectronic component 106 to be inserted into the pockets 104.

Alternately, the pockets 104 may be arranged in a more generic fashion to receive many different sizes and configurations of microelectronic components 106. In some embodiments, a carrier 102 may include pockets 104 for both specific and generic use. In an implementation, the carrier 102 has a coefficient of thermal expansion (CTE) that is similar to or the same as a CTE of the materials of the microelectronic components 106 to be mounted to the pockets 104. For example, the material for the carrier 102 may be selected from various materials, based on a desired CTE for the carrier 102. For the purposes of this disclosure, substantially similar CTEs are those that do not differ by more than 10 ppm.

The pockets 104 may be formed on the topside surface of the carrier 102 using lithography, etching, stamping, rolling, or other techniques. In an implementation, the terminals 108 (e.g., pads, posts, tabs, wires, pins, electrodes, contacts, etc.) of the microelectronic component 106 are inserted within the pockets 104 of the carrier 102 or disposed over the pockets 104. In many examples, the pockets 104 are at least partially filled with a reflowable conductive material (e.g., solder, etc.) prior to inserting the terminals 108 or disposing the device 106 over the pocket 104. In an embodiment, the pockets 104 are at least partially filled or filled using an injection molded soldering technique. In other embodiments, the pockets 104 may be filled via printing no-clean paste, deposition, electrodeposition, or the like. The terminals 108 may be fixed into place within the pockets 104 via heated reflow techniques, for example.

In various implementations, as shown in FIG. 1, the topside of the carrier may be etched, or the like, to include channels 110 for forming interconnects between some of the pockets 104. In various examples, the interconnect channels 110 may be formed along with the pockets 104, or may be formed in a separate process. For instance, the interconnect channels 110 and the pockets 104 may be etched using a patterned resist, which may be removed after the etching.

In some embodiments, the interconnect channels 110 may be at least partially filled or filled with a conductive material (e.g., copper, etc.) using printing techniques, deposition, electroless plating, electrodeposition, evaporation, sputtering, or the like. In an embodiment, the channels 110, and the associated interconnects, have a line/space width of approximately 1-2 um. In other embodiments, the channels 110 and interconnects have greater or lesser line/space distributions. In some implementations, the fine line conductive interconnects formed in the channels 110 comprise at least a portion of a topside fine-pitch redistribution layer (RDL).

Figure 2:
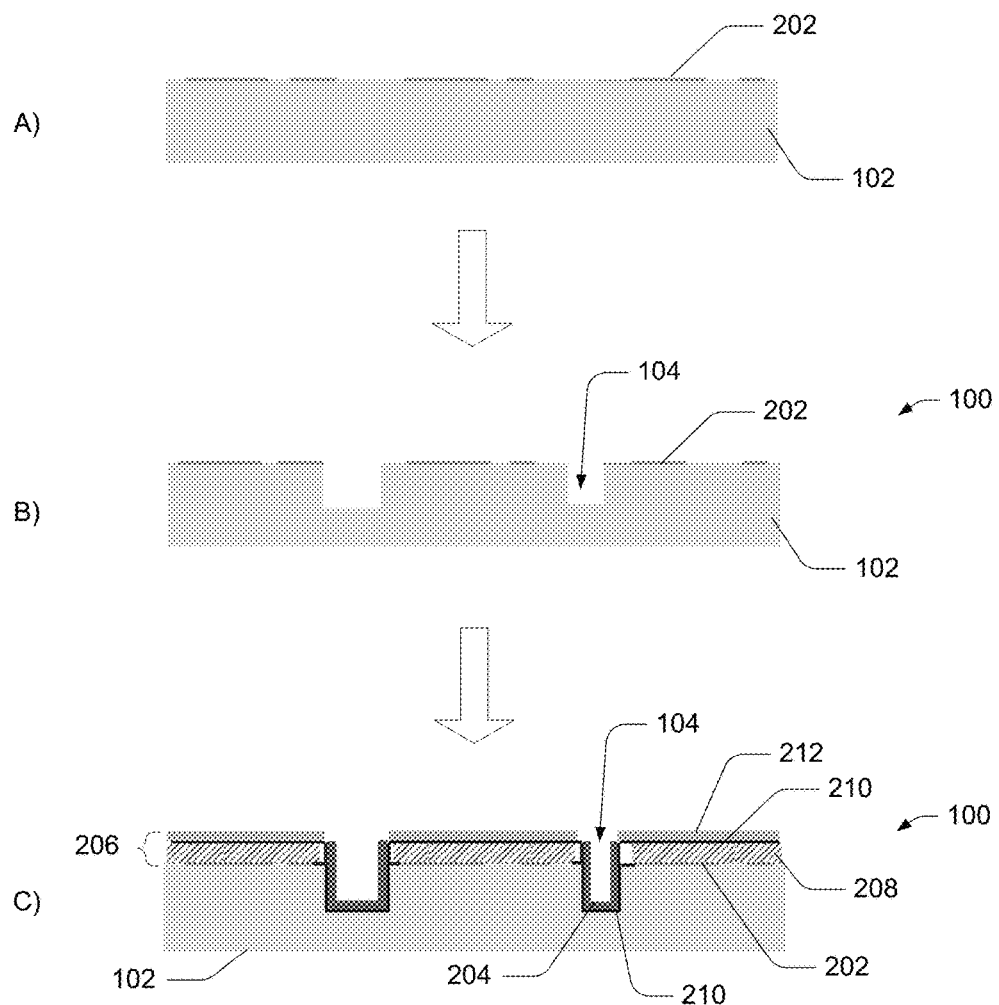
FIGS. 2 and 3 show example process steps for forming a hybrid interposer, according to an embodiment.
Figure 3:
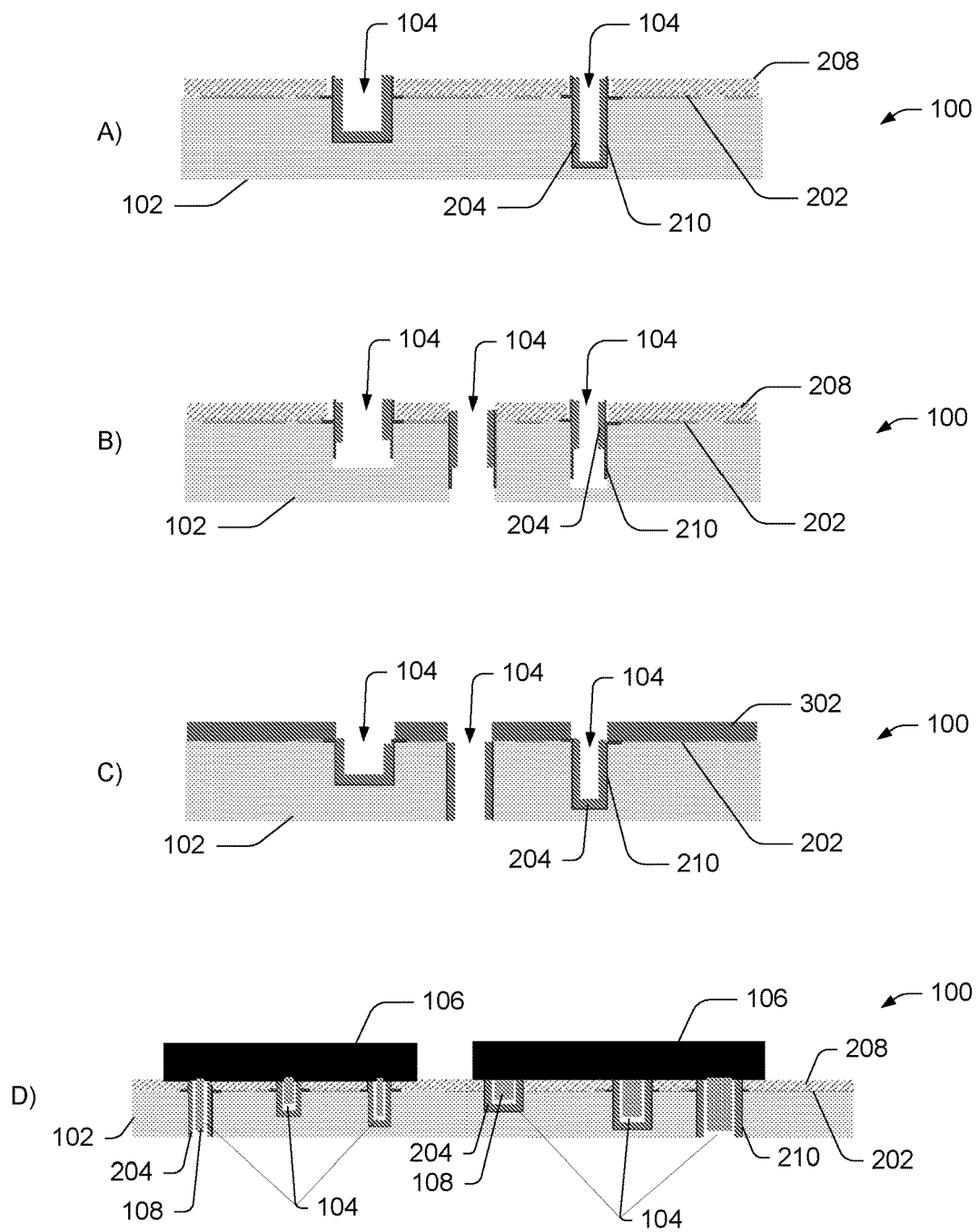

FIGS. 2 and 3 show example process steps for forming a hybrid interposer 100, according to an embodiment. The order of the steps as illustrated is not intended to be limiting, and the steps may occur in order desired. At (A) and (B) of FIG. 2, pockets 104 (and optionally channels 110) are formed on a topside surface of the carrier 102. Fine line metallization 202 is formed on the topside surface, and may be formed at least partially within the channels 110. In various examples, copper or other conductive materials may form the fine line metallization 202, using deposition or plating, or similar techniques.

In an implementation, as shown at (C), reflowable conductive material 204 is added within the pockets 104. In alternate implementations, other materials may be applied as desired, forming conductive layers for interconnections and insulating layers ("layers 206"). For example, one or more passivation layers 208 and conductive layers 210 may be formed, using resist layers 212, for instance. In the implementations, depending on the resist mask 212 used, one or more conductive layers 210 may be formed within the pockets 104 (as shown at FIG. 2(C)), generally prior to filling the pockets 104 with reflowable conductive material 204.

The illustrations at (A) and (B) of FIG. 3 show two examples of the carrier 102 after the resist cleaning and seed removal. A compliant (e.g., passivation) layer 208 may be formed on the topside surface of the carrier 102. Further, a metallization layer 210 and a reflowable conductive material 204 (e.g., solderable metallurgy layer) fill at least a portion of the pockets 104. As illustrated in FIGS. 3(A)-(D), the pockets 104 may be of varying sizes and dimensions to accommodate variations in post or pad dimensions. It may be desirable to fill the pockets 104 with more or less reflowable conductive material 204, depending on the dimensions of the terminals 108 of the microelectronic component(s) 106 to be placed in the pockets 104, for example.

As shown in FIG. 3(A), the reflowable conductive material 204 may be formed on the side walls and the bottom of the pockets 104, partially or fully filling the pockets 104. As illustrated at (B), the reflowable conductive material 204 may be formed only on the side walls of the pockets 104. In many cases, it is not necessary to fill the entire pocket 104 with reflowable conductive material 204.

FIG. 3(C) illustrates an embodiment using an underfill or gap-fill 302 (e.g., a NCP or NCF material, for instance). The gap-fill 302 may be used by itself as a passivation layer, or it may be used with an additional passivation layer 208. As shown at (D), microelectronic components 106 may be placed with their terminals 108 in the pre-filled pockets 104.

In various embodiments, the terminals 108 are placed in the pre-filled pockets 104 immediately after the pockets 104 receive the reflowable conductive material 204, and while the reflowable conductive material 204 is still pliable.

As mentioned above, the terminals 108 may have differing dimensions. The use of the pockets 104, having dimensions larger (e.g., wider and/or deeper) than the width and/or length of the terminals 108, facilitates a self-alignment of the terminals 108. For example, the terminals may have a width (diameter) of about 10 microns, and the pockets 104 may have a width (e.g., diameter) of about 12-20 microns.

Additionally, the depth of the pockets 104 may be 2-5 microns deeper than a length of the terminals 108. In some embodiments, the pockets 104 may be formed at varying depths or at several predetermined depths to accommodate various terminals 108. In one embodiment, at least some of the pockets 104 extend through the carrier 102. In some embodiments, the pockets 104 may have a circular or elliptical profile, rectangular or even trapezoidal or inverted trapezoid profile. In other embodiments, the pockets 104 may have a polygonal or irregular profile. In some embodiments, more than one terminal 108 or pad are disposed within a pocket 104 or over a pocket 104. Once the terminals 108 are in place within the pockets 104, the terminals 108 may be further fixed into place by heated reflow, for instance, or a like technique.

Figure 4:
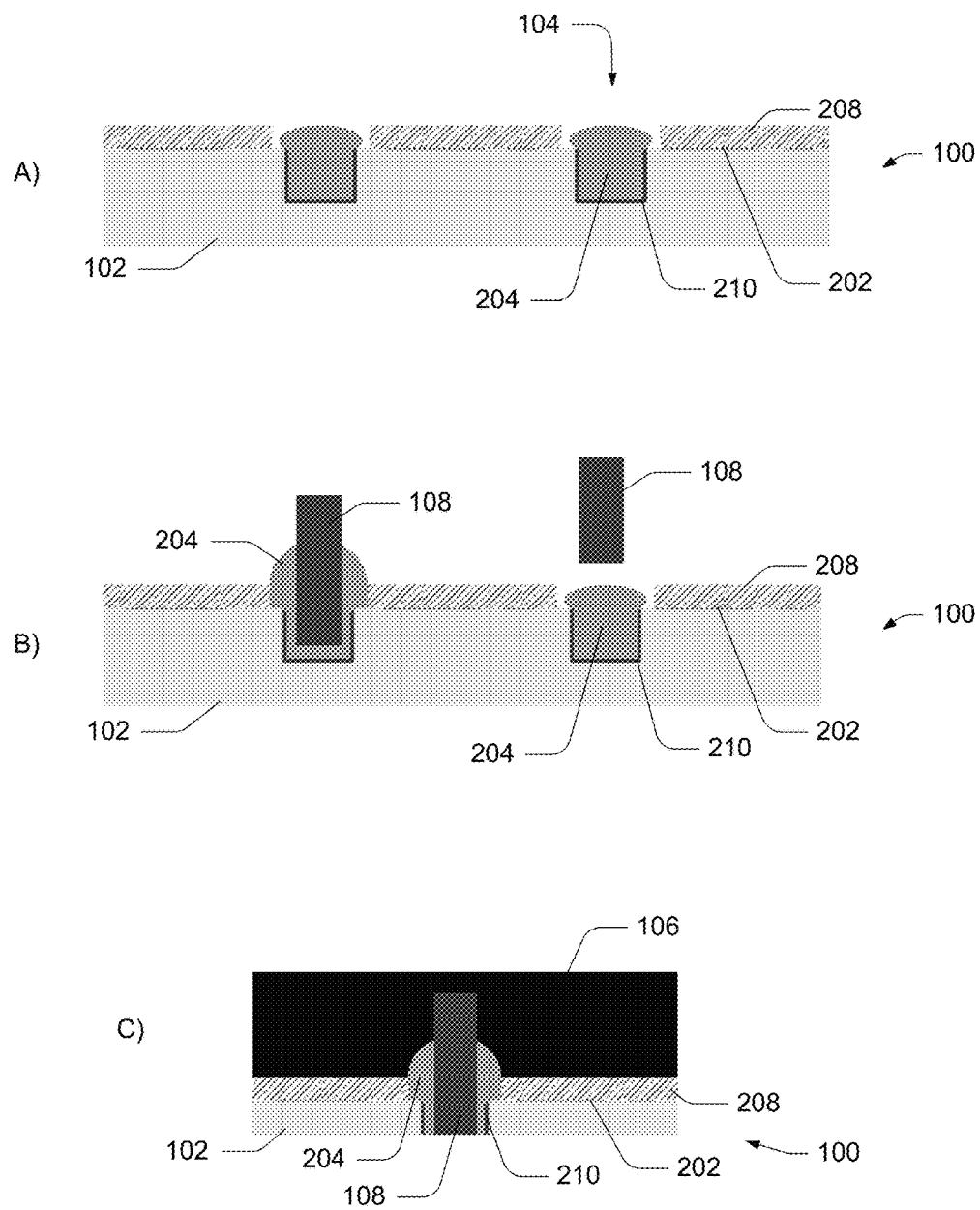
FIG. 4 shows example process steps for forming metal in a pocket of a carrier, according to an embodiment.

In an implementation, as shown in FIG. 4, the pockets 104 may be fully filled with reflowable conductive material 204 prior to installation of the terminals 108. A carrier 102 with pre-filled pockets 104 is shown at (A). At (B), terminals 108 are placed into the pockets 104, while the reflowable conductive material 204 is pliable. In an alternative embodiment, the reflowable conductive material 204 may be heated to allow for terminal 108 insertion. Note that in the illustration at (B), the terminals 108 are shown separate from the microelectronic component 106 for clarity of illustration.

As shown at (B) and (C), some of the reflowable conductive material 204 may be displaced out of the pocket 104 when the terminal 108 is inserted into the pocket 104. The displaced reflowable conductive material 204 and the reflowable conductive material 204 within the pocket 104 adhere to the terminal 108, fixing the microelectronic component 106 to the carrier 102. At (C), the microelectronic component 106 is shown coupled to the carrier 102, according to an embodiment.

Figure 5:
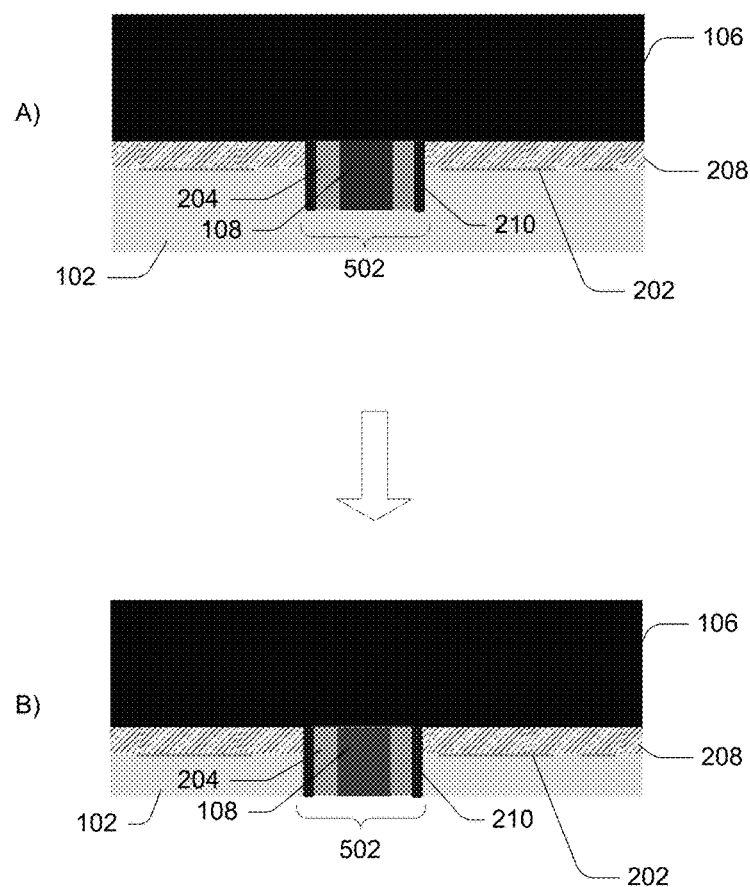
FIG. 5 shows example process steps for forming metal in a pocket of a carrier, according to another embodiment.

Referring to FIG. 5, after a reflow process or the like, a metallic structure 502 may be formed within the pocket 104. In various embodiments, the metallic structure 502 comprises the terminal 108, the reflowable conductive material 204, and the conductive layer 210, if present. In other implementations, the metallic structure 502 may include other conductive layers or components, if present. Further, the metallic structure 502 may be comprised of any combination of conductive materials (e.g., metals, alloys, conductive paste, solder, solder-like compounds, etc.) as desired.

In an implementation, as shown at (B), a portion of the backside of the carrier 102 may be removed (e.g., by grinding, blasting, etching, and their various combinations, etc.) to expose the pocket 104 and the metallic structure 502. For instance, the metallic structure 502 may be exposed for connection to a backside RDL or the like. In various examples, the metallic structure 502 may be flush with the backside surface of the carrier 102 after grinding, as shown in FIG. 5(B), or it may be protruding or recessed with respect to the backside surface of the carrier 102.

In various embodiments, the multiple pockets 104 of a carrier 102 may be etched to different depths for connection purposes. For example, in some embodiments, only a subset of the pockets 104 may be revealed by back-grinding the carrier 102. In such an example, some metallic structures 502 may be interconnected via the topside RDL for instance, and do not protrude through to the backside of the carrier 102. Accordingly, the pockets 104 may be etched to different depths to accommodate topside and backside connections as desired. In other embodiments, all of the pockets 104 may be revealed by back-grinding the carrier 102.

Figure 6:
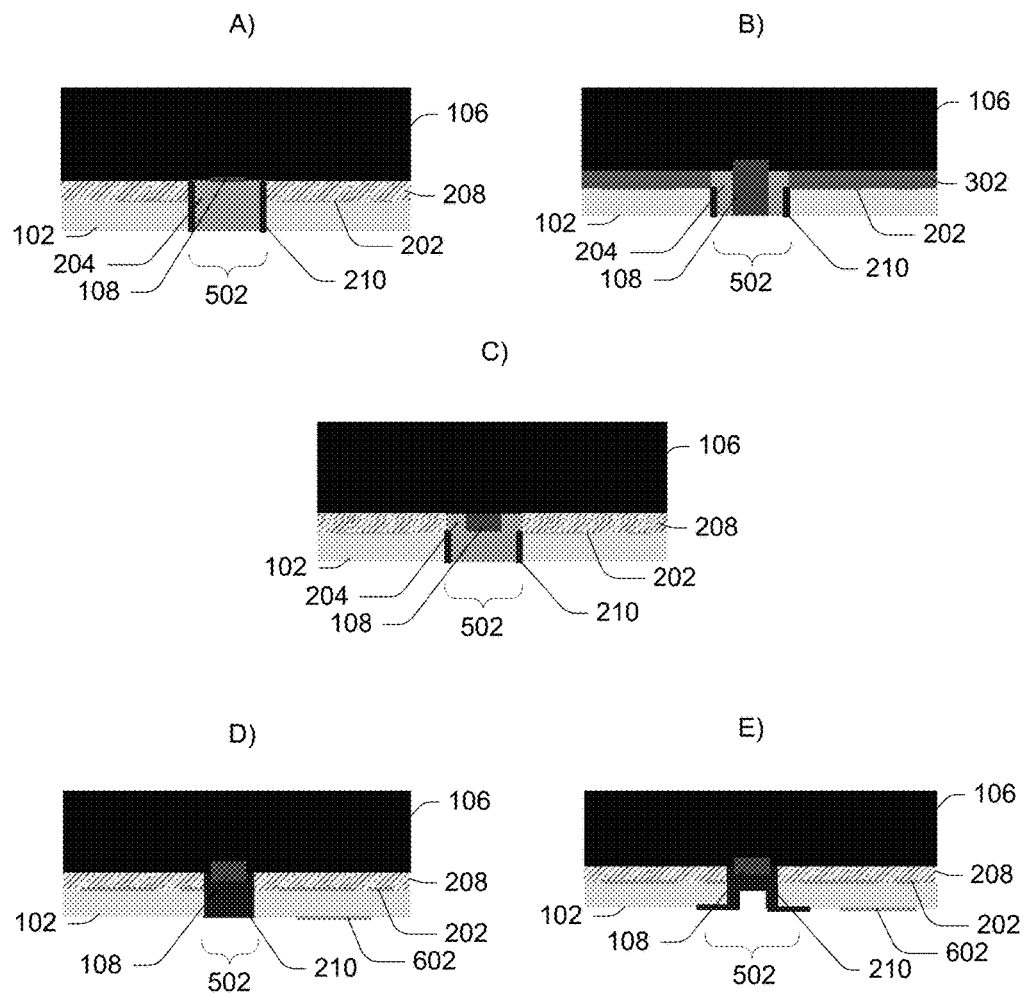
FIG. 6 shows several example embodiments of metallic structures formed in a pocket of a carrier.

FIG. 6 shows several example embodiments of metallic structures 502 formed in a pocket 104 of a carrier 102. In each of the illustrations (A-E) the backside surface of the carrier 102 has been removed (e.g., ground, etc.) to expose the metallic structures 502. At (A), the metallic structure 502 comprises a terminal 108 that may be slightly inserted (e.g., 2-3 microns deep) into the pocket 104. For example, the terminal 108 may be substantially flush or nearly flush with the passivation layer 202 on the topside surface of the carrier 102. The reflowable conductive material 204 fills the pocket 104, and with the conductive layer 210 and the terminal 108, forms the metallic structure 502.

At (B), the metallic structure 502 comprises a terminal 108 that may extend fully into the pocket 104 from the microelectronic component 106. In an embodiment, an underfill material 302 (e.g., NCP, for instance) may form a layer on the topside of the carrier 102. The reflowable conductive material 204 extends along the sidewalls of the pocket 104, and with the conductive layer 210 and the terminal 108, forms the metallic structure 502.

At (C), the metallic structure 502 comprises a terminal 108 that may extend partially or fully into the pocket 104 or disposed above the pocket 104 from the microelectronic component 106. As in (B), the conductive layer 210 lines the pocket 104 of the carrier 102. However, the reflowable conductive material 204 extends outside the carrier pocket 104, and beyond the dielectric layer 208 to the lower surface of the microelectronic component 106. The reflowable conductive material 204, the conductive layer 210, and the terminal 108 form the metallic structure 502.

At (D) and (E), the metallic structure 502 comprises a terminal 108 that may extend partially or fully into the pocket 104, or may be disposed above the pocket, while the pocket 104 is otherwise partially or fully filled with the conductive layer 210. The terminal 108 and the conductive layer 210 form an electrode that may be disposed flush or protrude outside (as shown at (D)) or recess inside (as shown at (E)) the pocket 104 of the carrier 102.

In FIGS. 6D and 6E, the conductive layer 210 may be formed after portions of the back side of the carrier 102 have been removed. In FIG. 6D, the pocket 104 may be filled from the backside completely and it may also be overfilled, such that the conductive structure 502 projects beyond the backside surface of the interposer 100 (and carrier 102). In FIG. 6E, the interposer pocket 104 is partially filled to form a recess cavity in the structure 502. In some embodiments, a surface of the conductive structure 502 may be coated with a protective conductive or non-conductive material. Also, in some implementations, the recess cavity of structure 502 may be at least partially filled with an insulating layer.

In various implementations, as also illustrated at (D) and (E), a backside RDL 602 may be formed on the backside of the carrier 102. The backside RDL may be formed on the backside of the carrier 102 at any of the illustrated embodiments (A-E) or other embodiments as well.

Figure 7:
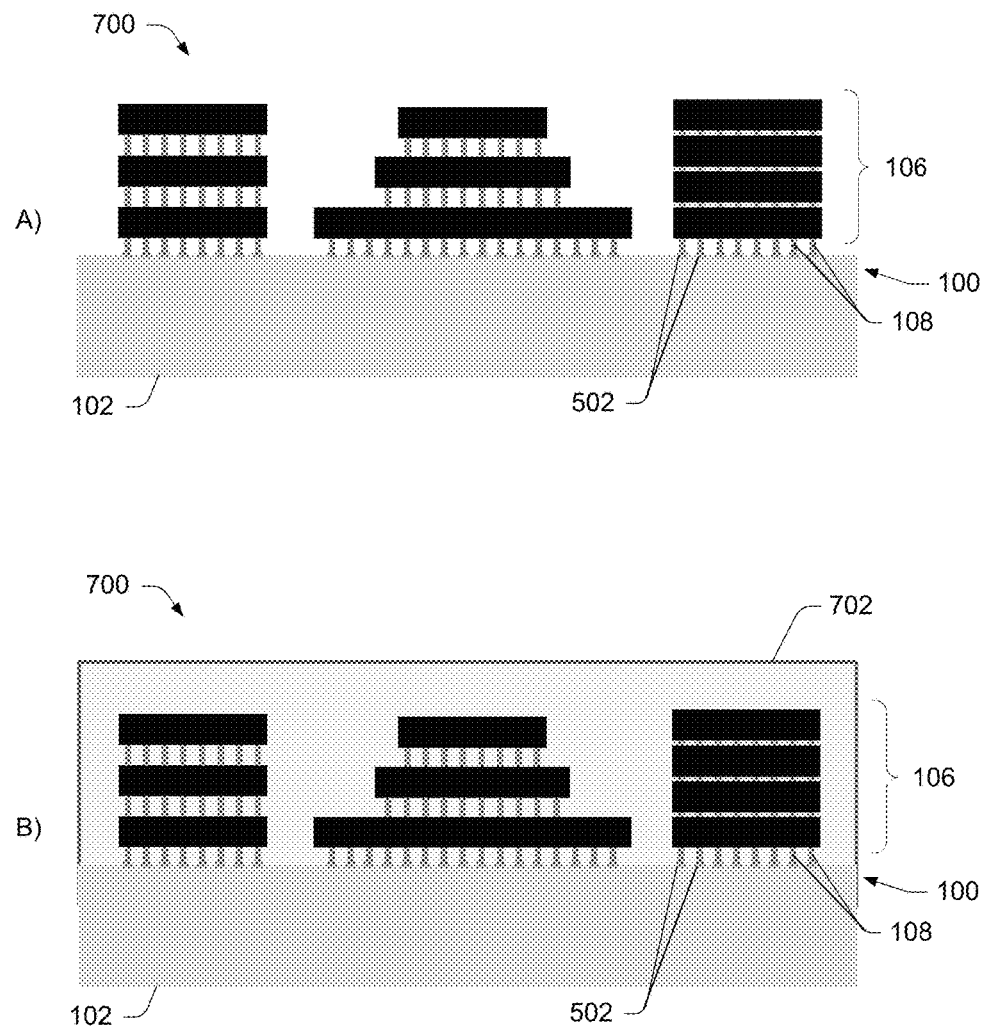
FIGS. 7-9 show example process steps for forming a 3D or 2.5D package assembly, according to various embodiments.
Figure 8:
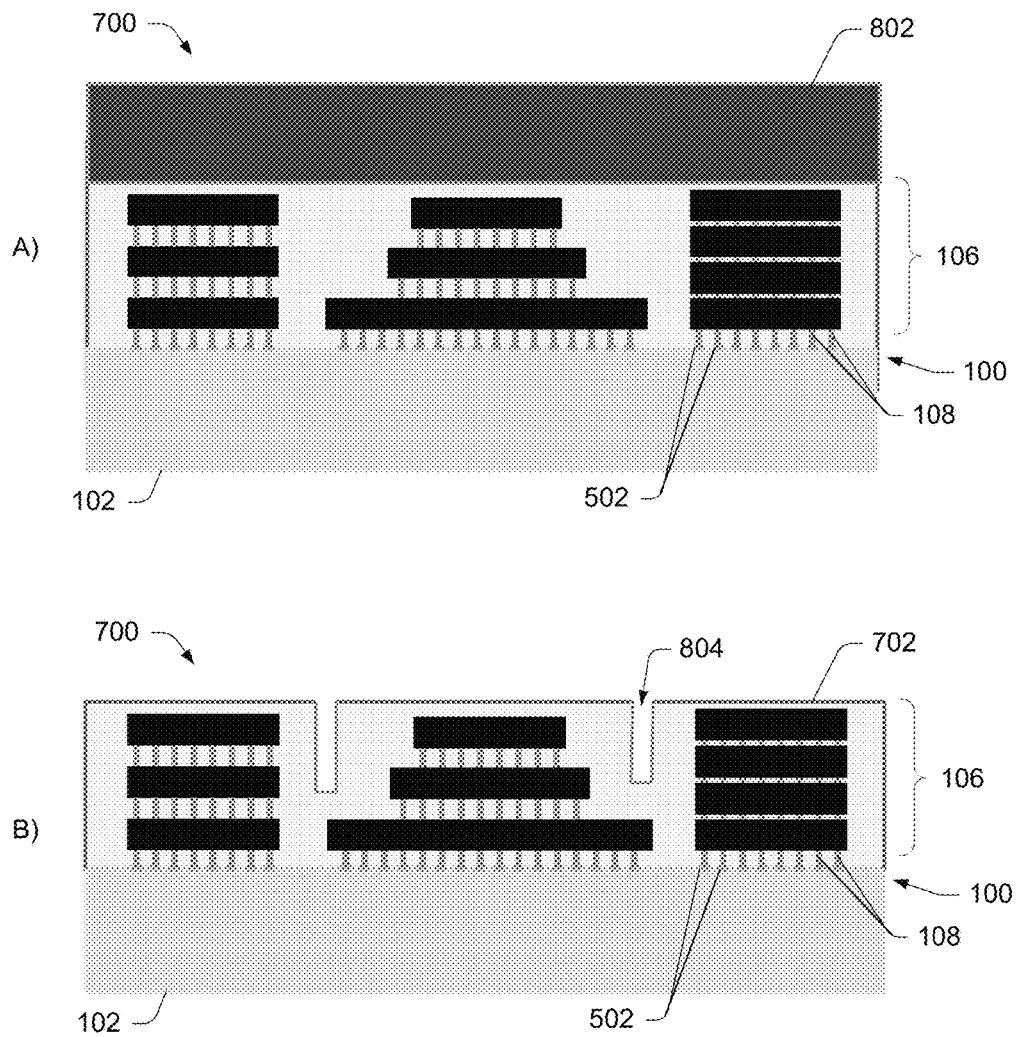
Figure 9:
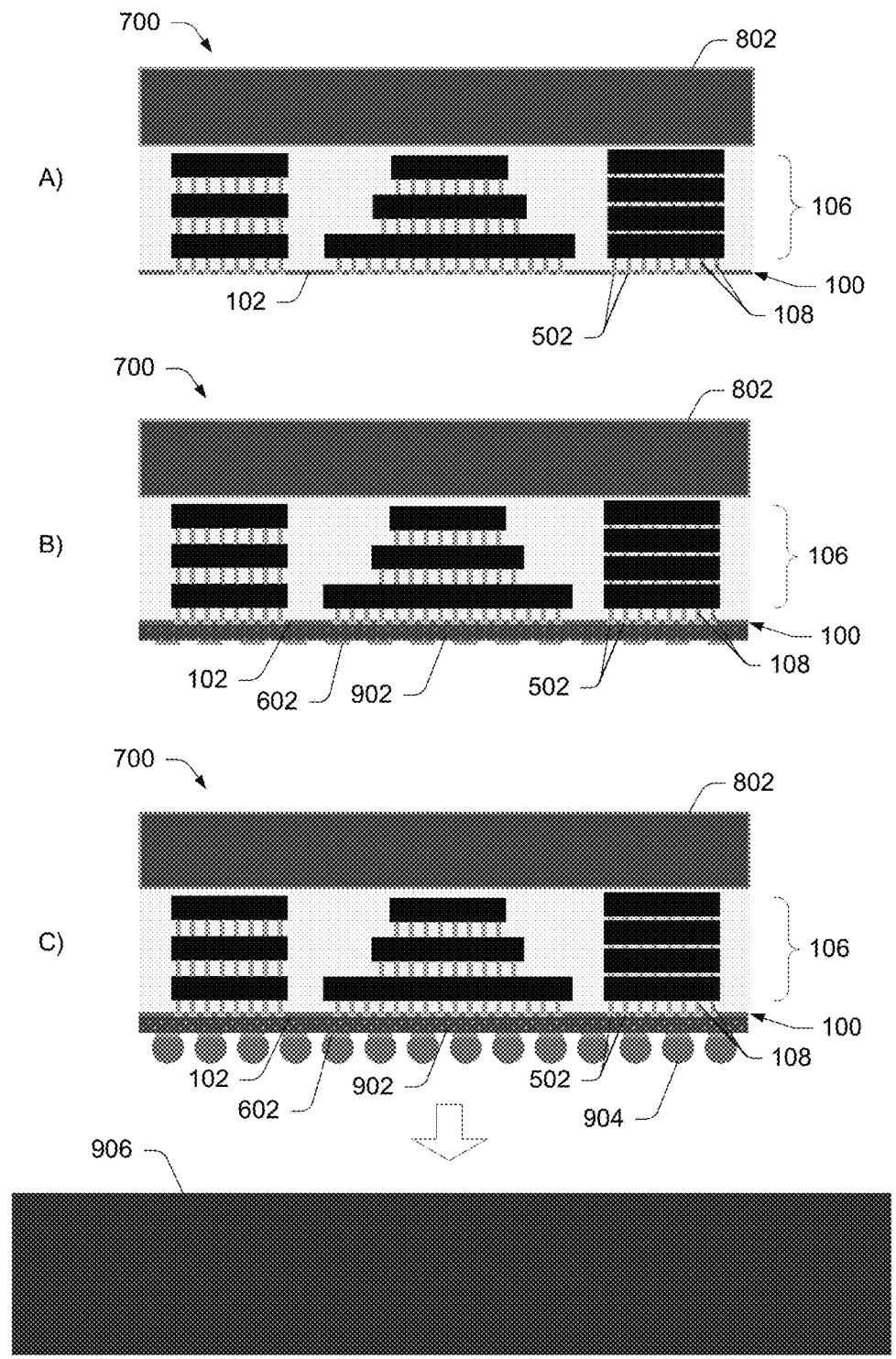

In various implementations, as illustrated in FIGS. 7-9, 3D and 2.5D package arrangements 700 may be formed by stacking multiple chip dice 106 (or other microelectronic components) to the topside of the hybrid interposer 100 (formed by the carrier 102, pockets 104, and metallic structures 502). FIGS. 7-9 show example process steps for forming a 3D or 2.5D package assembly 700, according to various embodiments.

Referring to FIG. 7, at (A) several microelectronic components 106 (including passive and/or active components) are stacked in one stack or multiple stacks on the topside of the carrier 102. In an implementation, the terminals 110 of the bottom-most die 106 of a stack are inserted within and fixed to the pre-filled pockets 104 via mass reflow, or the like (forming the metallic structures 502 within the pockets 104 of the carrier 102). In the implementation, a topside RDL may be formed on the topside surface of the carrier 102 comprised of fine line metallization. In some examples, the topside RDL may include one or more interconnections 110 that electrically couple some of the metallic structures 502 together.

Microelectronic components 106 in upper positions of a stack may communicate with the topside RDL, or with other dice 106 in the stack, through connections such as terminals, bumps, wirebonds, vias, and the like. In some embodiments, upper-stack microelectronic components 106 may be soldered to lower microelectronic components 106, or may be held in place by adhesives, or the like.

In an implementation, as shown at FIG. 7(B), an overmold 702 may be applied to the stacked arrangement 700 to provide a protective covering for the arrangement 700. The overmold 702 may be comprised of an underfill or encapsulant material, for instance. In an embodiment, no conventional capillary underfill technique is used with the arrangement 700. The overmold 702 may be cured before or after application of various arrangement 700 components.

Referring to FIG. 8, in various implementations, as shown at (A), a handle carrier 802 may be coupled to the overmold 702. In some embodiments, the overmold 702 may be planarized to achieve a flat surface, in preparation for the handle carrier 802. In various examples, the handle carrier 802 may be added for handling or protection of the arrangement 700, and can provide strength and rigidity to the arrangement 700 for further processing, such as while back-grinding the carrier 102.

In various embodiments, the handle carrier 802 is comprised of silicon, glass, polysilicon, metallurgical silicon, silicon carbide, carbon fiber-polyimide laminate, ceramic, or other materials, and may be selected to have a CTE that is similar to the CTE (e.g., within 10 ppm) of the interposer carrier 102. In one example, for instance when an element 106 comprises an optical sensor, the handle carrier 802 is at least partly optically transparent.

In another implementation, as shown at (B), the overmold 702 may include grooves, slots, or channels 804 in a top surface of the overmold 702. In the implementations, the channels 804 may be cut (e.g., sawn, etc.) in the top surface of the overmold 702. In one example, the channels 804 may be useful for breaking the stress field of the larger package arrangement 700. For instance, the channels 804 may allow for some flexing of the package without breakage during handling, processing (such as back-grinding, for example), or heating. In various embodiments, the overmold 702 may include the channels 804 and the handle carrier 802.

In an implementation, at least a portion of the backside surface of the interposer carrier 102 is removed, as shown in FIG. 9(A). In various embodiments, the backside surface is ground to reveal one or more of the metallic structures 502 and/or the pockets 104. In one embodiment, a subset of the metallic structures 502 and/or the pockets 104 is revealed with the back-grinding. In the embodiment, some of the metallic structures 502 remain isolated from the backside surface of the carrier 102 by the carrier 102 material. In another embodiment, all of the metallic structures 502 and/or the pockets 104 are revealed with the back-grinding. In some applications, the pocket structure 502 is revealed by combination of grinding and/or low stress removal methods such as etching. The etching step may comprise dry etch or wet etch processes, including wet microblasting.

In another implementation, a backside RDL 602 is formed on the prepared (e.g., ground) backside surface of the carrier 102. In various examples, the backside RDL 602 has a pitch that is coarser (i.e., greater) than a pitch of the topside RDL, providing fanout and a desired interconnect scale. As shown in FIG. 9(B), the RDL 602 may also be formed on the backside surface of a second carrier layer 902 (silicon, non-silicon, or an organic carrier layer, etc.) bonded to the backside of the carrier 102. As shown in FIG. 9(C), solder balls 904 or other terminal connections may be optionally coupled to the backside RDL 602 for connection to another carrier 906, such as a printed circuit board (PCB), or the like.

In various implementations, the ball grid assembly (BGA) of solder balls 904 may be directly coupled to the carrier 906 via reflow techniques, or the like. The package arrangement 700, as shown in FIGS. 9(B) and 9(C), includes no through silicon vias (TSVs) with the interposer 100 (comprising the carrier 102, pockets 104, and metallic structures 502, and optionally the topside RDL, interconnections 110, and backside RDL 602). Further, no additional substrate is needed with the arrangement 700 to couple the BGA of solder balls 904 to the carrier 906. In an embodiment, other interconnection techniques and components may be used to couple an arrangement 700 to a carrier 906 (e.g., wirebonds, pins, etc.). In various embodiments, the package arrangement 700 may include additional components or fewer components and remain within the scope of the disclosure.

Figure 10:
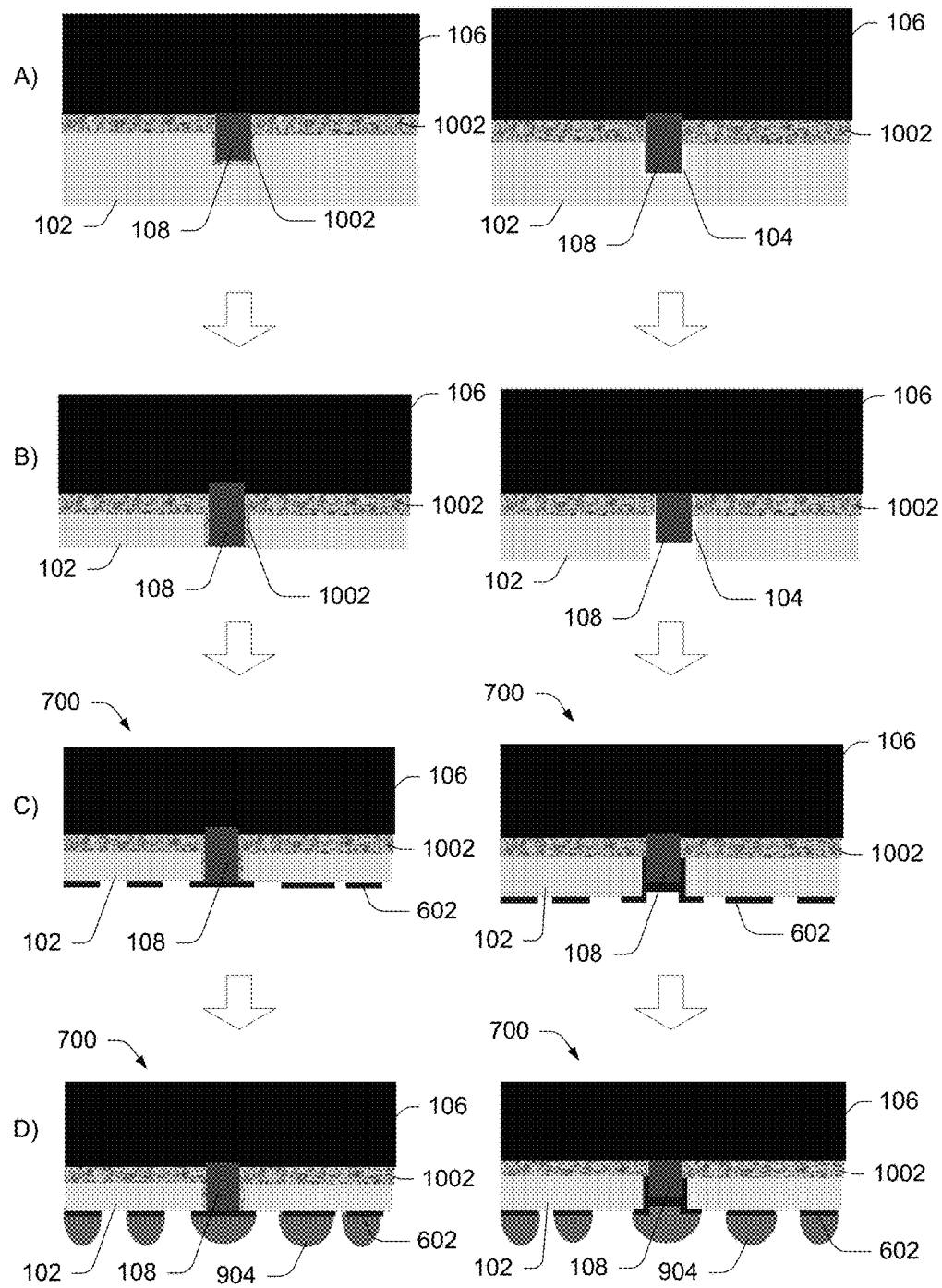
FIG. 10 shows example process steps for forming a chip package having a metal structure in a pocket of carrier, according to two example embodiments.

FIGS. 10-13 illustrate alternate methods of forming a package 700 for one or more microelectronic components 106 that provides a fanout for interconnections (e.g., fine pitch to coarse pitch), using a carrier 102. FIG. 10 shows example process steps for forming a microelectronic component 106 package 700, where a terminal 108 of the microelectronic component 106 is inserted into a pocket 104 of a carrier 102, according to two example embodiments. In the embodiments, an adhesive layer 1002 is used to attach the microelectronic component 106 to the carrier 102. In an embodiment, the adhesive layer 1002 includes sub-micron particles (or similar) to provide structure to the adhesive 1002.

At (A), the terminal 108 is inserted into the pocket 104 in the carrier 102, either with the adhesive layer 1002 within the pocket 104 also, or without the adhesive layer 1002 in the pocket 104. At (B), portions of the carrier 102 are removed from the backside surface of the carrier 102, exposing the terminal 108. The terminal 108 may be flush, or recessed with respect to the prepared (e.g., ground) backside surface of the carrier 102. At (C), the backside RDL 602 is formed on the prepared backside surface of the carrier 102. At (D), solderable material 904 (e.g., solder bumps, solder balls, or other interconnection terminals) may optionally be formed on the backside RDL 602, in preparation for mounting the package arrangement 700 to another carrier 906, or the like.

Still in another alternate embodiment, the microelectronic component 106 is affixed to the dielectric portion of the interposer 100 using bonding forces without an adhesive layer, and the terminal 108 is disposed within the pocket 104 (not shown). The assembled microelectronic components 106 and the interposer 100 may be heated to a temperature (below 150 degrees C., for example) to further increase the bond strength prior to thinning the interposer 100 from the back side to reveal the pocket 104 and terminal 108. A conductive material (such as conductive material 210, for instance) is applied to at least partially fill the exposed pocket 104 cavity and to electrically couple the backside of the interposer 100 to its front (i.e., topside) surface.

The backside RDL 602 is formed on the prepared backside surface of the carrier 102 and solderable material 904 (e.g., solder bumps, solder balls, or other interconnection terminals) may optionally be formed on the backside RDL 602, in preparation for mounting the package arrangement 700 to another carrier 906, or the like.

In yet another alternate embodiment, after the microelectronic component 106 is affixed to the dielectric portion of the interposer 100 using bonding forces without an adhesive layer and the terminal 106 is disposed within the pocket 104, the assembly 700 may be molded (not shown) prior to thinning the interposer 100 from the backside to expose the terminal 108 and the pocket 104. A conductive layer (such as conductive material 210, for instance) is then formed in the pocket 104 and on the backside of the interposer 100. Portions of the conductive layer may be etched to form the backside RDL layer 602.

Figure 11:
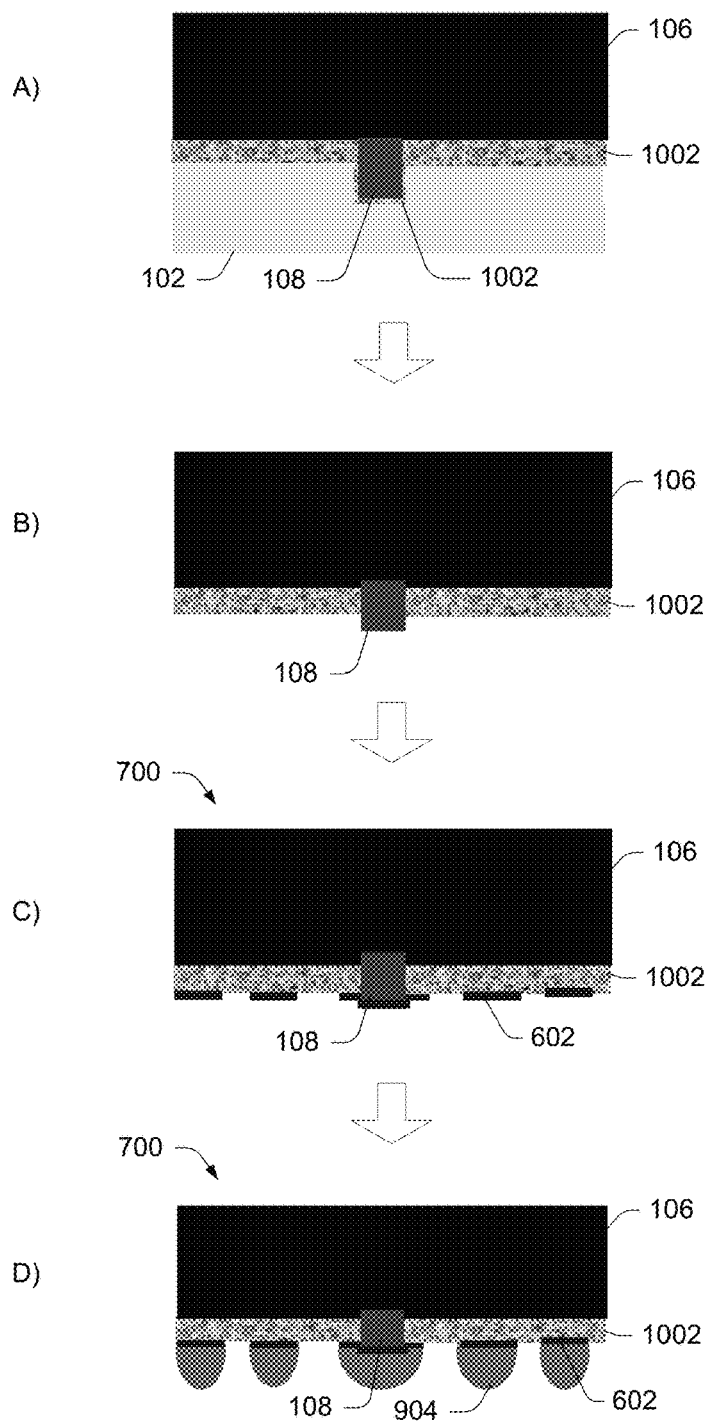
FIG. 11 shows example process steps for forming a chip package having a metal structure formed in a pocket of a carrier, according to an example embodiment.

An alternate embodiment, as illustrated in FIG. 11, shows alternate example process steps for forming a microelectronic component 106 package 700, where a terminal 108 of the microelectronic component 106 is initially inserted into a pocket 104 of a carrier 102. In the embodiment, an adhesive layer 1002 is used to attach the microelectronic component 106 to the carrier 102. At (A), the terminal 108 is inserted into the pocket 104 within the carrier 102, while the pocket 104 contains a layer of the adhesive 1002.

At (B), the carrier 102 is removed by etching or other techniques, and the remaining surface (including the adhesive layer 1002) is cleaned and dried. At (C), the backside RDL 602 is formed on the prepared backside surface, including the adhesive layer 1002. At (D), solderable material 904 (e.g., solder bumps, solder balls, or other interconnection terminals) may optionally be formed on the backside RDL 602, in preparation for mounting the package arrangement 700 to another carrier 906, or the like.

Figure 12:
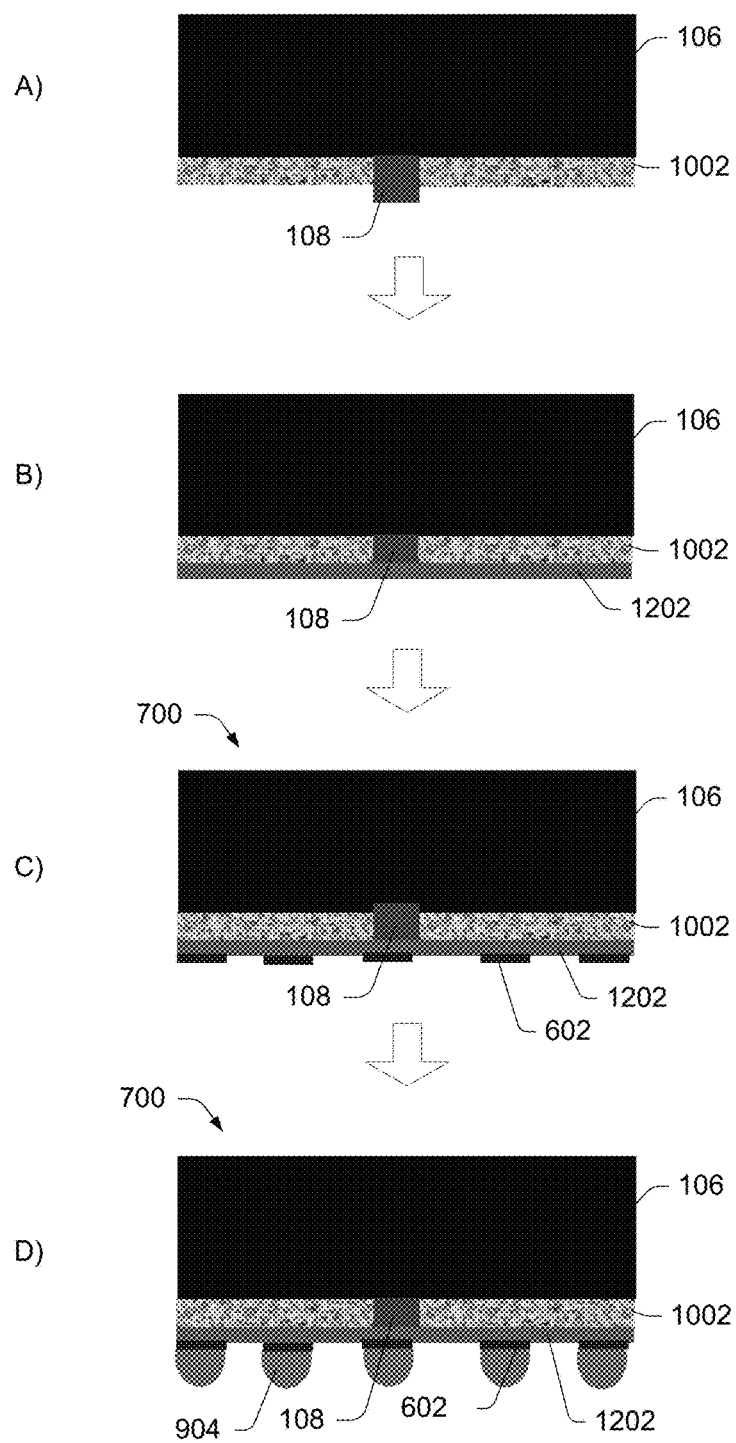
FIG. 12 shows example process steps for forming a chip package having a metal structure formed in a pocket of a carrier, according to another example embodiment.

FIG. 12 shows a similar example process to that described relative to FIG. 11, according to another embodiment. In the embodiment, an adhesive layer 1002 is used to attach the microelectronic component 106 to the carrier 102, and then the carrier 102 is removed by etching or other techniques. At (A), the remaining surface (including the adhesive layer 1002) is cleaned and dried. At (B), one or more layers of dielectric coating 1202 are applied to the prepared surface (including the adhesive layer 1002). At (C), the dielectric layer(s) 1202 are patterned, and the backside RDL 602 is formed on the patterned dielectric 1202. At (D), solderable material 904 (e.g., solder bumps, solder balls, or other interconnection terminals) may optionally be formed on the backside RDL 602, in preparation for mounting the package arrangement 700 to another carrier 906, or the like.

Figure 13:
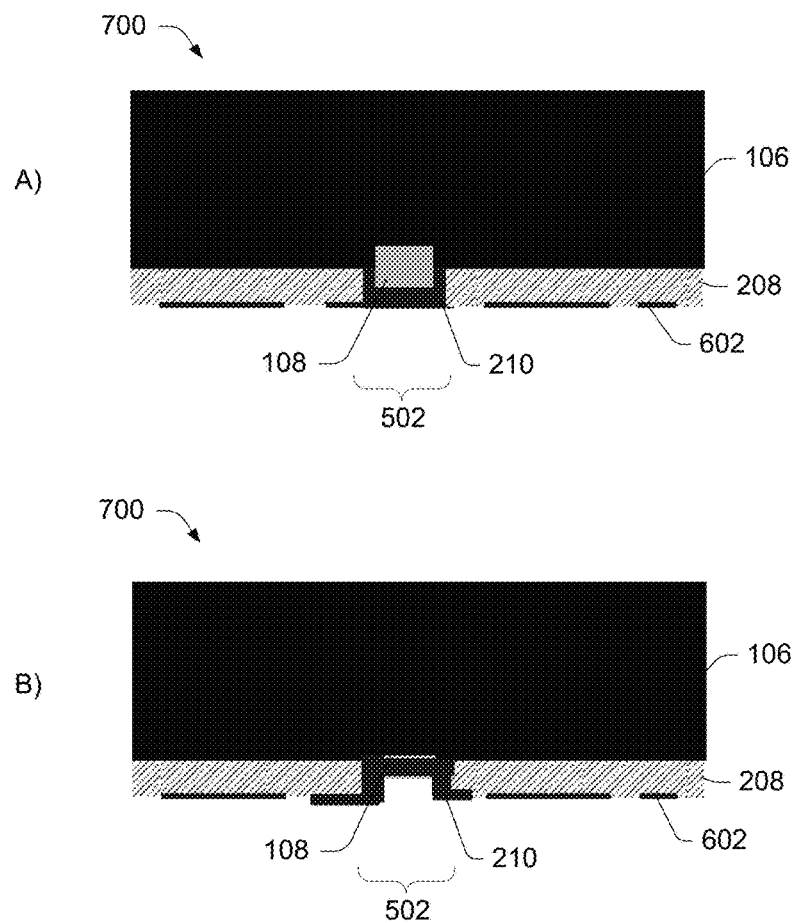
FIG. 13 shows two example embodiments of metallic structures formed in a dielectric cavity.

FIG. 13 shows two example embodiments of packages 700 having metallic structures 502 formed in a dielectric cavity. In the examples, a passivation or dielectric layer 208 is formed on a backside surface of the microelectronic component 106, forming a pocket around the terminal 108. A conductive layer 210 is formed around the terminal 108 within the pocket. For example, the conductive layer 210 may include sputtered metal plating, or the like. In an implementation, the metal plating may be added to the terminal 108 cavity from the backside of the package 700 at one or more stages of processing. The combination of the terminal 108 and the conductive layer 210 form a metallic structure 502. In the examples, a backside RDL 602 is formed on the dielectric layer 208.

In various embodiments, the metallic structure 502 is substantially flush with the backside surface of the dielectric layer 208, as shown at (A). In other embodiments, the metallic structure 502 is recessed with respect to the backside surface of the dielectric layer 208, as shown at (B). In an alternate embodiment, the metallic structure 502 may protrude with respect to the backside surface of the dielectric layer 208.

Unless otherwise specified, alternative components to those specifically mentioned may be used to implement the techniques described herein. In various implementations, a hybrid interposer 100 may be a stand-alone device, or it may be a portion of a system, component, structure, or the like, such as a microelectronic component 106 package 700. For example, the techniques described herein may be applied to groups or stacks or groups of stacks of packaged microelectronic components 106 formed on a die, a wafer, a substrate, or other carrier 906.

Figure 14:
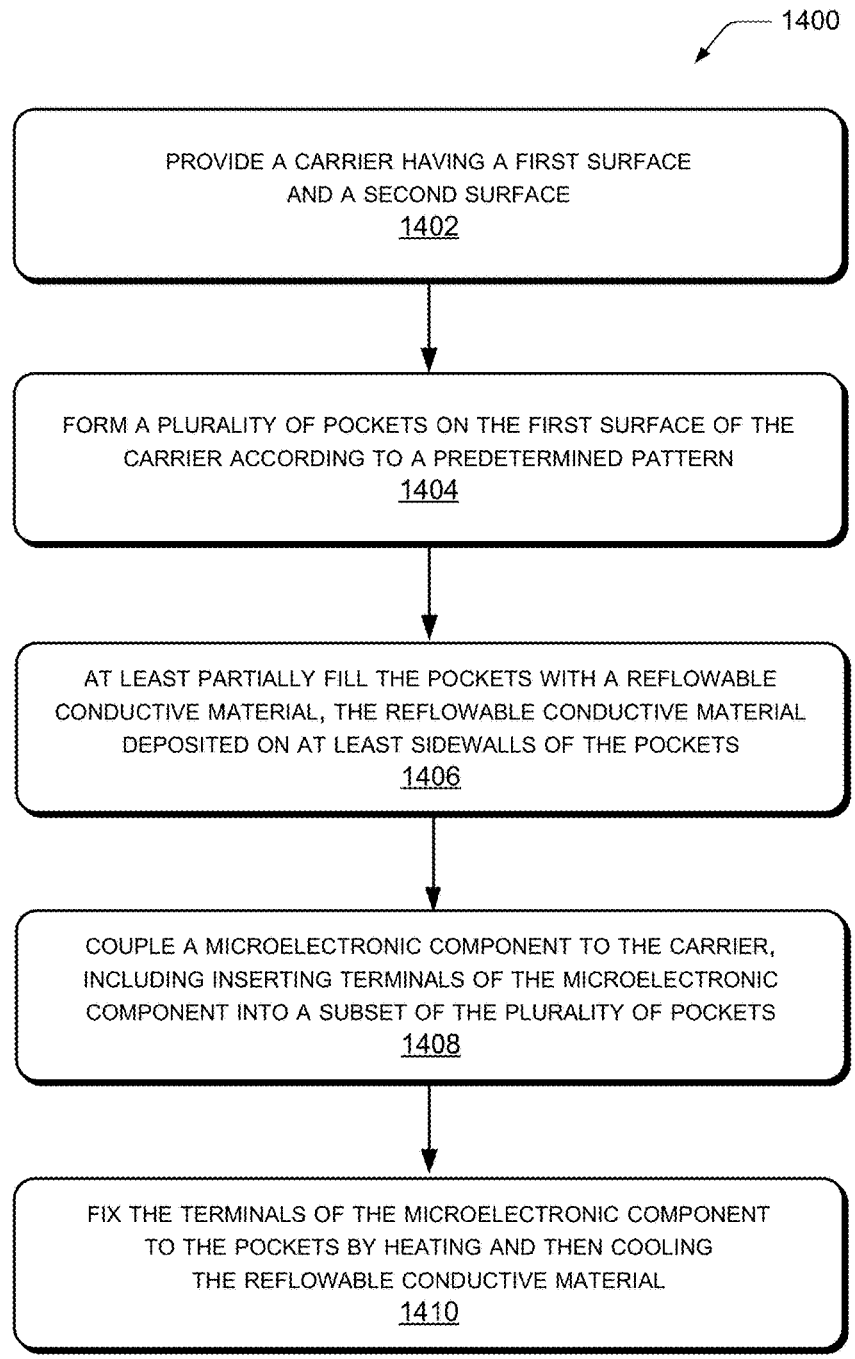
FIG. 14 is a flow diagram illustrating an example process for forming a hybrid interposer, according to an implementation.

FIG. 14 is a flow diagram illustrating an example process 1400 for forming a microelectronic component package arrangement (such as arrangement 700, for example) including a hybrid interposer (such as interposer 100, for example), according to various implementations. The use of the text-based flow diagram of FIG. 14 to illustrate the process described is one example that is not intended to be limiting. Further, FIGS. 1-13 and their respective discussions also illustrate example processes for forming a hybrid interposer 100 and/or a microelectronic component package 700, in the form of a graphics-based flow diagram. Each of the processes described with respect to FIGS. 1-14 also describe a corresponding apparatus, structure, system, or the like. The blocks of FIG. 14 have reference to the hybrid interposer and package arrangements shown at FIGS. 1-13.

At block 1402, the process includes providing a carrier having a first surface and a second surface. In various embodiments, the carrier is comprised of glass, a ceramic material, a composite, or other non-silicon material. In alternate embodiments, the carrier is comprised of silicon, polysilicon, or the like. Further, the material for the carrier may be selected to have a CTE that is similar to microelectronic components to be mounted on the carrier, for example.

At block 1404, the process includes forming a plurality of pockets on the first surface of the carrier according to a predetermined pattern. The pockets may be etched onto the first surface or cut using other technology as desired. In an implementation, the process includes spacing the plurality of pockets to match a pitch of the terminals of the microelectronic component to be mounted to the carrier. For instance, the pitch may comprise approximately 2 um to 60 um spacing or the like.

At block 1406, the process includes at least partially filling the pockets with a reflowable conductive material. In an embodiment, the reflowable conductive material is deposited on at least sidewalls of the pockets, and may include the bottom of the pockets, and most or the entire pocket. In an embodiment, the pockets are filled with the reflowable conductive material using an injection molded soldering technique. In other embodiments, the pockets may be filled via printing no-clean paste, deposition, or the like.

At block 1408, the process includes coupling a microelectronic component to the carrier, including inserting terminals of the microelectronic component into a subset of the plurality of pockets. In an implementation, the process includes forming a plurality of metallic structures within the pockets, the plurality of metallic structures comprising the reflowable conductive material and the terminals of the microelectronic component. In a further embodiment, the metallic structures include a deposited conductive layer in addition to or as an alternative to the reflowable conductive material.

In an implementation, the process includes forming a first redistribution layer (RDL) on the first surface of the carrier, having a pitch substantially equivalent to a pitch of the terminals of the microelectronic component. In an implementation, the first RDL includes one or more interconnections between predetermined metallic structures.

At block 1410, the process includes fixing the terminals of the microelectronic component to the pockets by heating the reflowable conductive material. For example, the terminals may be fixed into place within the pockets via mass heated reflow techniques, for example.

In an implementation, the process includes removing a portion of the second surface of the carrier (by grinding, etc.) to expose one or more of the metallic structures through to the second surface. In an implementation, the process includes removing the carrier entirely after formation of the plurality of metallic structures. In the implementation, a dielectric or other insulating material may surround the metallic structures instead of the carrier.

In an implementation, the process includes forming a second RDL on the second surface, having a greater pitch than a pitch of the terminals of the microelectronic component. In the implementation, the second RDL provides electrical connectivity for the microelectronic component to the second surface of the carrier via the first RDL, the second RDL, and the metallic structures. In various embodiments, terminals such as solder bumps, solderable balls (BGA), pins, or the like, may be coupled to the second RDL for connecting the second RDL to another carrier, such as a PCB, etc.

In an implementation, the process includes aligning the microelectronic component onto the first surface of the carrier and reducing or eliminating lateral displacement of the microelectronic component during a post reflow based on the pockets. In the implementation, the pockets can help to align the placement of the microelectronic component, and hold it in place during subsequent processing. The pockets may be sized to receive variations in terminal dimensions.

Different configurations of a hybrid interposer 100 or an arrangement 700 than those illustrated or discussed may be possible with different implementations. In alternate implementations, various other combinations and designs of a hybrid interposer 100 or an arrangement 700 are also within the scope of the disclosure. The variations may have fewer elements than illustrated in the examples shown in FIG. 1 through FIG. 13, or they may have more or alternative elements than those shown.

The order in which the processes are described herein is not intended to be construed as a limitation, and any number of the described process blocks can be combined in any order to implement the processes, or alternate processes. Additionally, individual blocks may be deleted from the processes without departing from the spirit and scope of the subject matter described herein. Furthermore, the processes can be implemented in any suitable materials, or combinations thereof, without departing from the scope of the subject matter described herein. In alternate implementations, other techniques may be included in the processes in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A microelectronic interposer, comprising:
a carrier having a first surface and a second surface;
a first plurality of pockets at predetermined locations on the first surface of the carrier having a spacing that matches a pitch of terminals of a first microelectronic component to be inserted into the first plurality of pockets, the first plurality of pockets having a first width dimension and being etched to different depths, one or more pockets of the first plurality of pockets being exposed through to the second surface of the carrier;
a second plurality of pockets at predetermined locations on the first surface of the carrier having a spacing that matches a pitch of terminals of a second microelectronic component to be inserted into the second plurality of pockets, the second plurality of pockets having a second width dimension greater than the first width dimension and being etched to different depths, one or more pockets of the second plurality of pockets being exposed through to the second surface of the carrier; and
a reflowable conductive material deposited on at least sidewalls of the first plurality of pockets and the second plurality of pockets.

2. The microelectronic interposer of claim 1, further comprising a fine-pitch redistribution layer (RDL) including a fine line metallization on the first surface, the fine-pitch RDL arranged to electrically couple terminals inserted into a subset of the first plurality of pockets and the second plurality of pockets.

3. The microelectronic interposer of claim 2, further comprising a coarse-pitch RDL on the second surface, having a pitch greater than the fine-pitch RDL, and arranged to couple the first microelectronic component and the second microelectronic component to another carrier having a pitch greater than a pitch of the first microelectronic component or the second microelectronic component.

4. The microelectronic interposer of claim 1, further comprising metallic structures formed within the first plurality of pockets, the metallic structures comprising the terminals of the first microelectronic component and the reflowable conductive material.

5. The microelectronic interposer of claim 1, further comprising a conductive layer lining at least a portion of the first plurality of pockets and/or the second plurality of pockets.

6. The microelectronic interposer of claim 1, wherein the carrier is comprised of a glass, a ceramic, or a non-silicon material.

7. The microelectronic interposer of claim 1, wherein the carrier has a coefficient of thermal expansion (CTE) that is similar to or the same as a CTE of the materials of the first microelectronic component and/or the second microelectronic component.

8. The microelectronic interposer of claim 1, wherein the first plurality of pockets have a pitch scaling of less than 20 microns.

9. A microelectronic package arrangement, comprising:
an interposer, including:
a carrier having a first surface and a second surface;
a first plurality of pockets having a first width dimension and a second plurality of pockets having a second, greater width dimension at predetermined locations on the first surface of the carrier having a spacing to match a pitch of terminals of one or more microelectronic components, the first plurality of pockets and the second plurality of pockets being etched to different depths, a subset of the first plurality of pockets and the second plurality of pockets being exposed through to the second surface; and
a reflowable conductive material disposed on at least sidewalls of the first plurality of pockets and the second plurality of pockets; and
one or more microelectronic components coupled to the first surface of the carrier, terminals of the one or more microelectronic components inserted into a subset of the first plurality of pockets and/or the second plurality of pockets, the reflowable conductive material and the terminals of the one or more microelectronic components forming a plurality of metallic structures;
a first redistribution layer (RDL) on the first surface of the carrier, arranged to electrically couple together one or more terminals of the one or more microelectronic components, including terminals within pockets not exposed through to the second surface being interconnected via the first RDL; and
a second RDL on the second surface of the carrier, having a greater pitch than the first RDL, and arranged to provide electrical connectivity for the one or more microelectronic components to the second surface of the carrier via the first RDL, the second RDL, and the metallic structures.

10. The microelectronic package arrangement of claim 9, further comprising a conductive layer deposited within the first plurality of pockets and the second plurality of pockets, and wherein the metallic structures comprise the terminals and the reflowable conductive material at least partially surrounded by the conductive layer.

11. The microelectronic package arrangement of claim 10, wherein at least one metallic structure comprises an electrode comprising at least a portion of a terminal of a microelectronic component and the conductive layer, the conductive layer filling at least a portion of a pocket occupied by the terminal.

12. The microelectronic package arrangement of claim 10, wherein at least one metallic structure includes reflowable material that at least partially fills a pocket and extends outside of the pocket.

13. The microelectronic package arrangement of claim 9, further comprising one or more stacks of multiple microelectronic components coupled to the first surface of the carrier, and wherein terminals of a bottom-most microelectronic component of a stack are inserted into a subset of the first plurality of pockets or the second plurality of pockets.

14. The microelectronic package arrangement of claim 9, further comprising an overmold encapsulating and providing a protective cover for the one or more microelectronic components.

15. The microelectronic package arrangement of claim 14, wherein a topside surface of the overmold includes one or more stress-relief grooves.

16. The microelectronic package arrangement of claim 14, further comprising a handle carrier coupled to a top surface of the overmold and providing rigidity during processing of the microelectronic package arrangement.

17. The microelectronic package arrangement of claim 9, further comprising a second carrier bonded to the second surface of the carrier, the second RDL being formed on a backside surface of the second carrier.

18. The microelectronic package arrangement of claim 9, further comprising a ball grid array (BGA) of solderable terminals formed on the second RDL.

19. The microelectronic package arrangement of claim 9, wherein at least a portion of the second surface of the carrier is removed to reveal one or more pockets of the first plurality of pockets and the second plurality of pockets and/or the metallic structures.

20. The microelectronic package arrangement of claim 19, wherein a remainder of the metallic structures not revealed are interconnected via the first RDL.

21. The microelectronic package arrangement of claim 9, wherein an adhesive, an encapsulant, a dielectric, or a filler forms an insulating layer around the metallic structures, and the second RDL is disposed on a backside surface of the insulating layer.

\* \* \* \* \*